(12) United States Patent
Kim

(10) Patent No.: US 9,148,098 B2
(45) Date of Patent: Sep. 29, 2015

(54) DIFFERENTIAL AMPLIFIER CIRCUIT

(71) Applicant: SK hynix Inc., Gyeonggi-do (KR)

(72) Inventor: Hyung-Soo Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 66 days.

(21) Appl. No.: 14/027,824

(22) Filed: Sep. 16, 2013

(65) Prior Publication Data

US 2014/0312971 A1 Oct. 23, 2014

(30) Foreign Application Priority Data

Apr. 17, 2013 (KR) .................. 10-2013-0042218

(51) Int. Cl.
  *H03F 1/02* (2006.01)
  *H03F 3/45* (2006.01)
  *H03F 1/30* (2006.01)
(52) U.S. Cl.
  CPC ............ *H03F 3/45188* (2013.01); *H03F 1/303* (2013.01); *H03F 3/45183* (2013.01); *H03F 3/45475* (2013.01); *H03F 2203/45318* (2013.01); *H03F 2203/45396* (2013.01); *H03F 2203/45562* (2013.01); *H03F 2203/45616* (2013.01)
(58) Field of Classification Search
  CPC .............. H03F 1/0227; H03F 1/0266; H03F 2200/432; H03F 2200/451; H03F 2200/555; H03F 3/24; H03F 2200/102; H03F 3/195; H03F 1/086; H03F 2200/375; H03F 2200/471; H03F 2200/91; H03F 3/45071; H03F 1/02; H03F 3/45475; H03F 1/303; H03F 3/005; H03F 3/387; H03F 3/45977; H03F 3/45183; H03F 3/45179; H03F 3/45192; H03F 3/45188
  USPC .................. 330/9, 51, 253; 327/124, 307
  See application file for complete search history.

(56) References Cited

U.S. PATENT DOCUMENTS

| 5,124,663 | A  | * | 6/1992 | McEntarfer et al. | .............. 330/9 |
| 7,042,384 | B2 | * | 5/2006 | Shimizu et al. | ............... 341/156 |
| 8,248,108 | B2 | * | 8/2012 | Santoro et al. | .................... 330/9 |
| 8,493,139 | B2 | * | 7/2013 | Sayuk | ............................... 330/9 |

FOREIGN PATENT DOCUMENTS

| KR | 1020090024444 | 3/2009 |
| KR | 1020120116121 | 10/2012 |

\* cited by examiner

*Primary Examiner* — Khanh V Nguyen
(74) *Attorney, Agent, or Firm* — IP & T Group LLP

(57) ABSTRACT

A differential amplifier circuit includes a differential amplification unit suitable for amplifying difference between signals of an input terminal and a complementary input terminal, receiving the same voltage level through the input terminal and the complementary input terminal at a measurement period, and receiving an input signal and a complementary input signal through the input terminal and the complementary input terminal, respectively, at an operation period, an offset control unit suitable for generating offset information using an output of the differential amplification unit at the measurement period, and an offset compensation unit suitable for compensating for an offset of the differential amplification unit in response to the offset information.

5 Claims, 3 Drawing Sheets

DIFFERENTIAL AMPLIFIER CIRCUIT

CROSS-REFERENCE TO RELATED APPLICATIONS

The present application claims priority of Korean Patent Application No. 10-2013-0042218, filed on Apr. 17, 2013, which is incorporated herein by reference in its entirety.

BACKGROUND

1. Field

Exemplary embodiments of the present invention relate to a differential amplifier circuit.

2. Description of the Related Art

A differential amplifier circuit is a circuit to amplify a voltage difference between two signals which are inputted in a differential manner, and is used in almost all kinds of integrated circuit chips so as to receive a signal from outside a chip or amplify an internal signal of the chip. For example, a memory may include several hundred to thousand differential amplifier circuits.

FIG. 1 is a diagram illustrating a conventional differential amplifier circuit.

Referring to FIG. 1, the differential amplifier circuit 100 serves to receive a pair of differential input signals including an input signal IN and a complementary input signal INB and amplify a voltage difference between the input signals IN and INB to output an output signal OUT and a complementary output signal OUTB. When the voltage of the input signal IN is higher than the voltage of the complementary input signal INB, the differential amplifier circuit 100 outputs the output signal OUT at a high level and outputs the complementary output signal OUTB at a low level. When the voltage of the complementary input signal INB is higher than the voltage of the input signal IN, the differential amplifier circuit 100 outputs the output signal OUT at a low level and outputs the complementary output signal OUTB at a high level. The differential amplifier circuit 100 may receive a clock CLK and perform an operation synchronized with the clock CLK or may operate in an asynchronous manner without receiving the clock CLK.

In an ideal case, the differential amplifier circuit 100 may amplify the output signal OUT to a high level and amplify the complementary output signal OUTB to a low level, even though the input signal IN is slightly higher than the complementary input signal INB. Furthermore, the differential amplifier circuit 100 may amplify the output signal OUT to a low level and amplify the complementary output signal OUTB to a high level even though the complementary input signal INB is slightly higher than the input signal IN. However, an ideal differential amplifier circuit does not exist, and the real differential amplifier circuit 100 may not perform a normal amplification operation when a voltage level difference between the input signal IN and the complementary input signal INB is not equal to or more than a predetermined offset value. For example, when the voltage level of the input signal IN is higher than the voltage level of the complementary input signal INB but the voltage level difference is insufficient, the differential amplifier circuit 100 may perform an abnormal amplification operation. For example, the differential amplifier circuit 100 may output the output signal OUT at a low level and output the complementary output signal OUTB at a high level, i.e., an opposite operation to the normal differential amplification operation.

A variety of schemes have been proposed to cancel an offset of the differential amplifier circuit. However, the schemes necessarily require a large and complex circuit. Thus, the schemes may be applied to a system having a small number of differential amplifier circuits, but may not be applied to a system having a large number of differential amplifier circuits.

SUMMARY

Various exemplary embodiments are directed to a technique for reducing an offset of a differential amplifier circuit through a simple configuration.

In accordance with an exemplary embodiment of the present invention, a differential amplifier circuit includes a differential amplification unit suitable for amplifying difference between signals of an input terminal and a complementary input terminal, receiving the same voltage level through the input terminal and the complementary input terminal at a measurement period, and receiving an input signal and a complementary input signal through the input terminal and the complementary input terminal, respectively, at an operation period, an offset control unit suitable for generating offset information using an output of the differential amplification unit at the measurement period, and an offset compensation unit suitable for compensating for an offset of the differential amplification unit in response to the offset information.

In accordance with another exemplary embodiment of the present invention, a differential amplifier circuit includes an input terminal suitable for receiving a preset voltage at a measurement period and receiving an input signal at an operation period, a complementary input terminal suitable for receiving the preset voltage at the measurement period and receiving a complementary input signal at the operation period, a first pull-down element controlled by a signal of the input terminal and suitable for pull-down driving a first node using a voltage of a common source node, a second pull-down element controlled by a signal of the complementary input terminal and suitable for pull-down driving a second node using the voltage of the common source node, a first inverter suitable for using a pull-up voltage and a voltage of the first node as driving voltages and driving a pre-output node in response to a complementary pre-output node, a second inverter suitable for using the pull-up voltage and a voltage of the second node as driving voltages and driving the complementary pre-output node in response to the pre-output node, a third inverter suitable for driving an output terminal in response to the pre-output node, a fourth inverter suitable for driving a complementary output node in response to the complementary pre-output node, an offset control unit suitable for generating offset information using one or more signals of the output terminal and the complementary output terminal at the measurement period, and an offset compensation unit suitable for adjusting loadings of the first and second nodes in response to the offset information.

DETAILED DESCRIPTION

Figure 1:
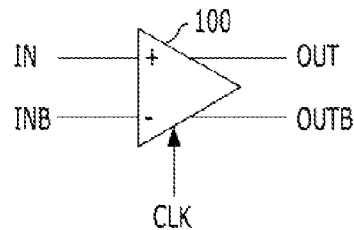
FIG. 1 is a diagram illustrating a conventional differential amplifier circuit.

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
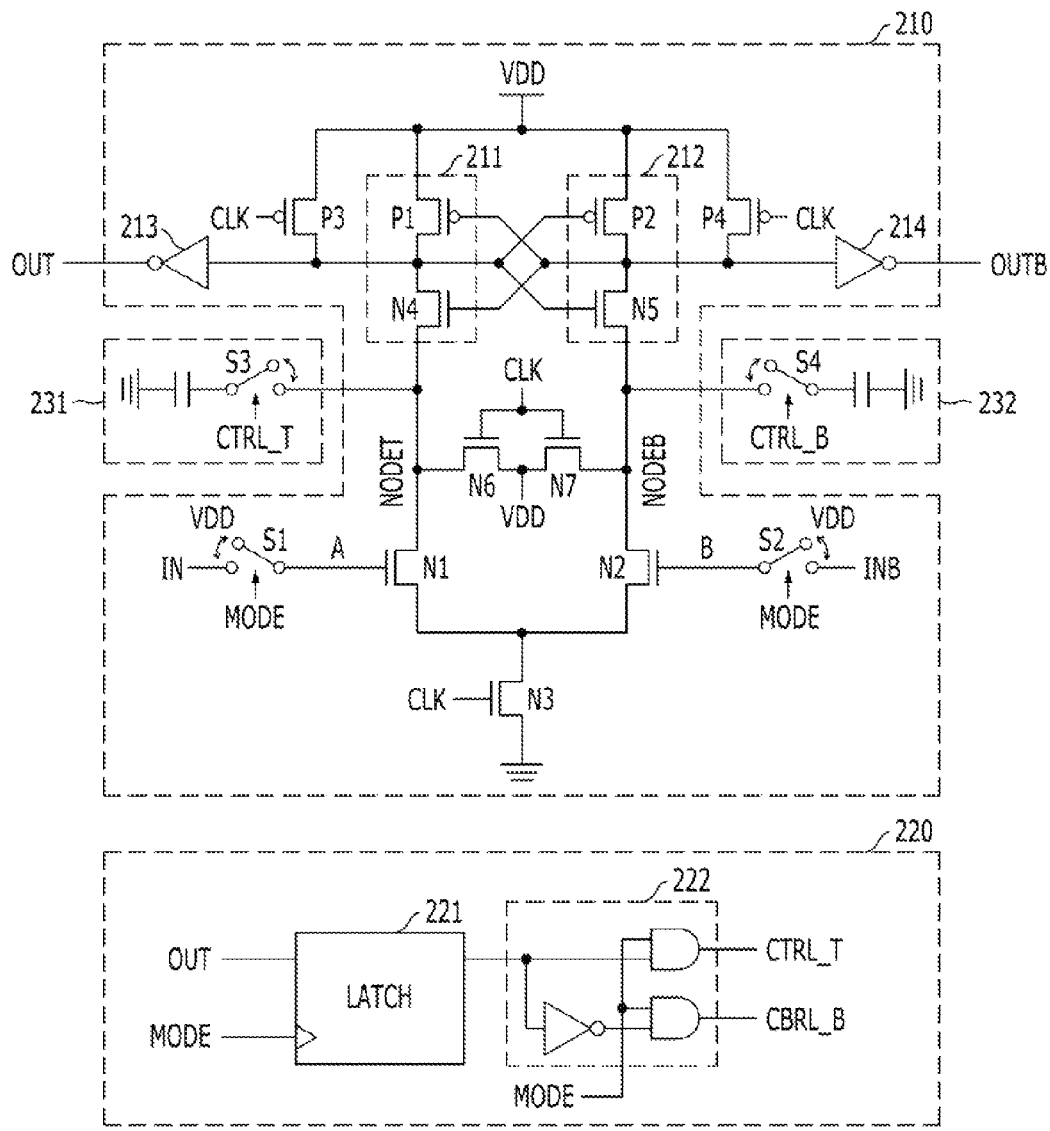
FIG. 2 is a circuit diagram of a differential amplifier circuit in accordance with an exemplary embodiment of the present invention.

FIG. 2 is a circuit diagram of a differential amplifier circuit in accordance with an exemplary embodiment of the present invention.

Referring to FIG. 2, the differential amplifier circuit includes a differential amplification unit 210, an offset control unit 220, and an offset compensation unit 231 and 232. The differential amplification unit 210 serves to differentially amplify signals of an input terminal A and a complementary input terminal 5, receive the same voltage level VDD through the input terminal A and the complementary input terminal B at a measurement period, and receive an input signal IN and a complementary input signal INB through the input terminal A and the complementary input terminal B, respectively, at an operation period. The offset control unit 220 serves to generate offset information CTRL_T and CTRL_B using an output OUT of the differential amplification unit 210 at the measurement period. The offset compensation unit 231 and 232 is configured to compensate for an offset of the differential amplification unit 210 in response to the offset information CTRL_T and CTRL_B.

The operation of the differential amplifier circuit of FIG. 2 is divided into an operation of the measurement period and an operation of the operation period. The measurement period indicates duration for measuring an offset of the differential amplification unit 210, and the operation period indicates duration in which the differential amplification unit 210 performs a normal operation to amplify the input signals IN and INB. The measurement period and the operation period are distinguished from each other through a mode signal MODE, and the mode signal MODE maintains a low level at the measurement period and maintains a high level at the operation period.

The differential amplification unit 210 differentially amplifies the differential input signals received through the input terminal A and the complementary input terminal B and outputs the output signal OUT and the complementary output signal OUTB. When the voltage level of the input terminal A is higher than the voltage level of the complementary input terminal B, the differential amplification unit 210 outputs the output signal OUT and the complementary output signal OUTB at a high level and a low level respectively. When the voltage level of the complementary input terminal B is higher than the voltage level of the input terminal A, the differential amplification unit 210 outputs the output signal OUT and the complementary output signal OUTB at a low level and a high level, respectively. Switches S1 and S2 are switched to receive the same voltage level VDD through the input terminal A and the complementary input terminal B during the measurement period in which the mode signal MODE is at a low level, and switched to receive the input signal IN and the complementary input signal INB through the input terminal A and the complementary input terminal B, respectively, during the operation period in which the mode signal MODE is at a high level.

Since the same voltage level VDD is inputted to the input terminal A and the complementary input terminal B of the differential amplification unit 210 at the measurement period in which the mode signal MODE is at a low level, the differential output signals OUT and OUTB of the differential amplification unit 210 reflect an offset of the differential amplification unit 210. When the output signal OUT is high and the complementary output signal OUTB is low at the measurement period, it may indicate that the offset of the differential amplification unit 210 has a value to output the output signal OUT at a high level. When the output signal OUT is low and the complementary output signal OUTB high at the measurement period, it may indicate that the offset of the differential amplification unit 210 has a value to output the output signal OUT at a low level. FIG. 2 illustrates that the same voltage level inputted to the input terminal A and the complementary input terminal B of the differential amplification unit 210 is a power supply voltage VDD. However, this is only an example, and the same voltage level may be inputted to the input terminal A and the complementary input terminal B of the differential amplification unit 210 at the measurement period, regardless of the level of the voltage. For example, a ground voltage may be inputted to the input terminal A and the complementary input terminal B of the differential amplification unit 210 at the measurement period. Since the differential amplification unit 210 receives the input signal IN and the complementary input signal INB at the operation period, the differential amplification unit 210 performs an amplification operation to differentially amplify the input signal IN and the complementary input signal INB.

The differential amplification unit 210 includes a first pull-down element N1, a second pull-down element N2, a first inverter 211, a second inverter 212, a third inverter 213, and a fourth inverter 214. The first pull-down element N1 is controlled by a signal of the input terminal A, and configured to pull-down drive a first node NODET using the voltage of a common source node CS. The second pull-down element N2 is controlled by a signal of the complementary input terminal B, and configured to pull-down drive a second node NODEB using the voltage of the common source node C. The first inverter 211 is configured to use the power supply voltage VDD as a pull-up driving voltage, use the voltage of the first node NODET as a pull-down driving voltage, and drive a pre-output node P_OUT in response to a complementary pre-output node P_OUTB. The second inverter 212 is configured to use the power supply voltage VDD as a pull-up driving voltage, use the voltage of the second node NODEB as a pull-down driving voltage, and drive the complementary pre-output node POUTB in response to the pre-output node P_OUT. The third inverter 213 is configured to drive the output terminal OUT in response to the pre-output node P_OUT. The fourth inverter 214 is configured to drive the complementary output terminal OUTB in response to the complementary pre-output node P_OUTB. The differential amplification unit 210 may further include transistors N3, N6, N7, P3, and P4 for reset.

The differential amplification unit 210 will be described in more detail. When the clock CLK is high, the transistor N3 is turned on, and the transistors N6, N7, P3, and P4 are turned off. Thus, the operation of the differential amplification unit 210 is enabled. On the other hand, when the clock CLK is low, the transistor N3 is turned off, and the transistors N6, N7, P3, and P4 are turned on. Thus, the operation of the differential amplification unit 210 is disabled, and the nodes P_OUT, P_OUTB, NODET, and NODEB are reset to a high level. That is, the differential amplification unit 210 performs an amplification operation in synchronization with the clock CLK during a period in which the clock CLK is high. During the measurement period, the clock CLK is maintained at a high level, and the differential amplification unit 210 continuously performs an amplification operation. When the voltage level of the input terminal A is higher than the voltage level of the complementary input terminal B and the clock CLK is high, the voltage level of the first node NODET is lower than the voltage level of the second node NODEB, and the voltage level of the pre-output node P_OUT is lower than the voltage level of the complementary pre-output node P_OUTB. As a result, a high level signal and a low level signal are outputted to the output terminal OUT and the complementary output terminal OUTB, respectively. When the voltage level of the input terminal A is higher than the voltage level of the complementary input terminal B and the clock CLK is high, the voltage level of the second node NODEB is lower than the voltage level of the first node NODET, and the voltage level of the complementary pre-output node P_OUTB is lower than the voltage level of the pre-output node P_OUT. As a result, a low level signal and a high level signal are outputted to the output terminal OUT and the complementary output terminal OUTB, respectively.

The offset control unit 220 is configured to receive and store the output OUT of the differential amplification unit 210 in the measurement period where the mode signal MODE is a low level, and output the offset information CTRL_T and CTRL_B using the stored signal in the operation period where the mode signal MODE is a high level. The offset information CTRL_T and CTRL_B includes a first signal CTRL_T for reducing a tendency in which the output signal OUT of the differential amplification unit 210 is activated to a high level and a second signal CTRL_B for reducing a tendency in which the complementary output signal OUTB of the differential amplification unit 210 is activated to a high level. When the output signal OUT of the differential amplification unit 210 is at a high level in the measurement period, it means that the differential amplification unit in 210 has an offset to output the output signal OUT at a high level. In this case, the offset control unit 220 activates the first signal CTRL_T in the operation period. On the other hand, when the output signal OUT of the differential amplification unit 210 is at a low level in the measurement period, it means that the differential amplification unit 210 has an offset to output the output signal OUT at a low level. In this case, the offset control unit 220 activates the second signal CTRL_B in the operation period.

The offset control unit 220 includes a latch 221 and an offset output section 222. The latch 221 is configured to store the output signal OUT while the mode signal MODE is at a low level, and maintain the stored value while the mode signal MODE is at a high level. Furthermore, the offset output section 222 is configured to deactivate both of the first and second signals CTRL_T and CTRL_B to a low level while the mode signal MODE is at a low level, and activate one of the first and second signals CTRL_T and CTRL_B according to the signal stored in the latch 221 while the mode signal MODE is at a high level. For example, the offset output section 222 activates the first signal CTRL_T to a high level when the level of the output signal OUT stored in the latch 221 is high, and activates the second signal CTRL_B to a high level when the level of the output signal OUT stored in the latch 221 is low. FIG. 2 illustrates that the offset control unit 220 receives the output signal OUT of the differential amplification unit 210 and generates the offset information CTRL_T and CTRL_B. However, since the complementary output signal OUTB has the opposite level of the output signal OUT but contains the same information, the offset control unit 220 may generate the offset information CTRL_T and CTRL_B using the complementary output signal OUTB. The offset control unit 220 may generate the offset information CTRL_T and CTRL_B using both of the output signal OUT and the complementary output signal OUTB.

The offset compensation unit 231 and 232 is configured to compensate for an offset of the differential amplification unit 210 in response to the offset information CTRL_T and CTRL_B, The offset compensation unit 231 and 232 compensates for an offset of the differential amplification unit by adjusting loadings of the first and second nodes in response to the offset information. The offset compensation unit includes a first capacitor 231 connected to the first node NODET when the first signal CTRL_T is activated and a second capacitor 232 connected to the second node NODEB when the second signal CTRL_B is activated. When the first capacitor 231 is connected to the first node NODET, the loading of the first node NODET increases. Thus, it becomes difficult to activate the output signal OUT to a high level, and it becomes easy to activate the complementary output signal OUTB to a high level. Furthermore, when the second capacitor 232 is connected to the second node NODEB, the loading of the second node NODEB increases. Thus, it may be difficult to activate the complementary output signal OUTB to a high level, and it may be easy to activate the output signal OUT to a high level.

The differential amplifier circuit measures an offset of the differential amplification unit 210 during the measurement period, and compensates for the offset of the differential amplification unit 210 using the offset measured at the measurement period during the operation period. Thus, the differential amplification unit 210 may accurately amplify a minute difference between the input signal IN and the complementary input signal INB without the offset. Furthermore, since only the simple storage circuit 220 for measuring an offset and the simple capacitors 231 and 232 for compensating for an offset are used, a small number of circuits are added for offset compensation. Considering that several hundred to thousand differential amplifier circuits are used in an integrated circuit chip, such an advantage may contribute greatly to reduce the area of the integrated circuit chip.

Figure 3:
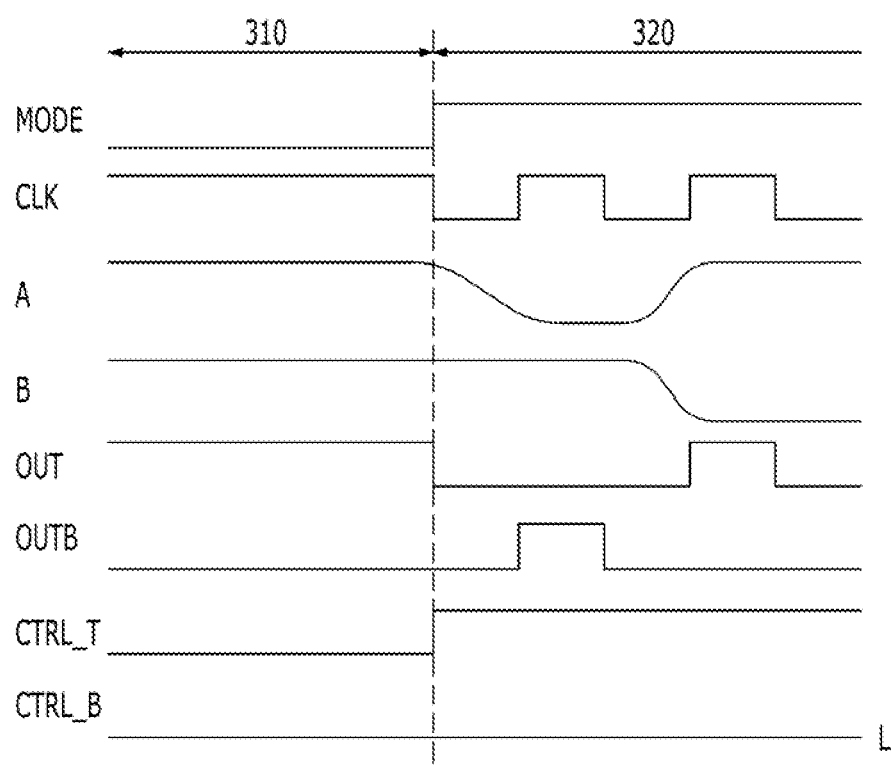
FIG. 3 is a timing diagram illustrating an operation of the differential amplifier circuit shown in FIG. 2.

FIG. 3 is a timing diagram illustrating the operation of the differential amplifier circuit shown in FIG. 2.

Referring to FIG. 3, during the measurement period 310 in which the mode signal MODE is at a low level, the voltage levels of the input terminal A and the complementary input terminal B are fixed to the power supply voltage VDD, and the clock CLK is fixed to a high level. During the measurement period 310, the output signal OUT is outputted at a high level, and the complementary output signal OUTB is outputted at a low level. When the output signals OUT and OUTB are generated in such a manner even though the same voltage level is applied to the input terminal A and the complementary input terminal B, it means that the differential amplification unit 210 has an offset of outputting the output signal OUT at a high level.

During the operation period 320 in which the mode signal MODE is at a high level, the first signal CTRL_T is activated to a high level. This is because the high-level output signal OUT is stored in the latch 221 at the measurement period 310. During the operation period 320, the differential amplification unit 210 operates to cancel an offset that outputs the output signal OUT at a high level through the activation of the first signal CTRL_T. The differential amplification unit 210 operates in synchronization with the clock CLK. During a period in which the clock CLK is high, the differential amplification unit 210 differentially amplifies the signals of the input terminal A and the complementary input terminal 8 and outputs the output signal OUT and the complementary output signal OUTB. Furthermore, during a period in which the clock CLK is low, the differential amplification unit 210 fixes the output signal OUT and complementary output signal OUTB to a low level.

The operation of the measurement period 310 for measuring an offset may be performed only one time during the initial operation of a system including the differential amplifier circuit, for example, an integrated circuit chip. That is, the operation of the measurement period 310 may be performed only one time at the initial stage, and the operation of the operation period 320 may be continuously performed during the other periods. In this case, since the differential amplifier circuit may continuously perform an operation of amplifying the input signals IN and INB after the initial operation, it is possible to reduce the time required for measuring an offset. Alternatively, the operation of the measurement operation 310 may be repetitively performed. That is, the operation of the measurement period 310 may be performed a plurality of times at a predetermined period. For example, the measurement period 310 and the operation period 320 may be alternately repeated at the predetermined period. In this case, the time during which the differential amplifier circuit performs an amplification operation may be reduced, but it is possible to deal with a change in offset occurring during the operation of the differential amplifier circuit.

Figure 4:
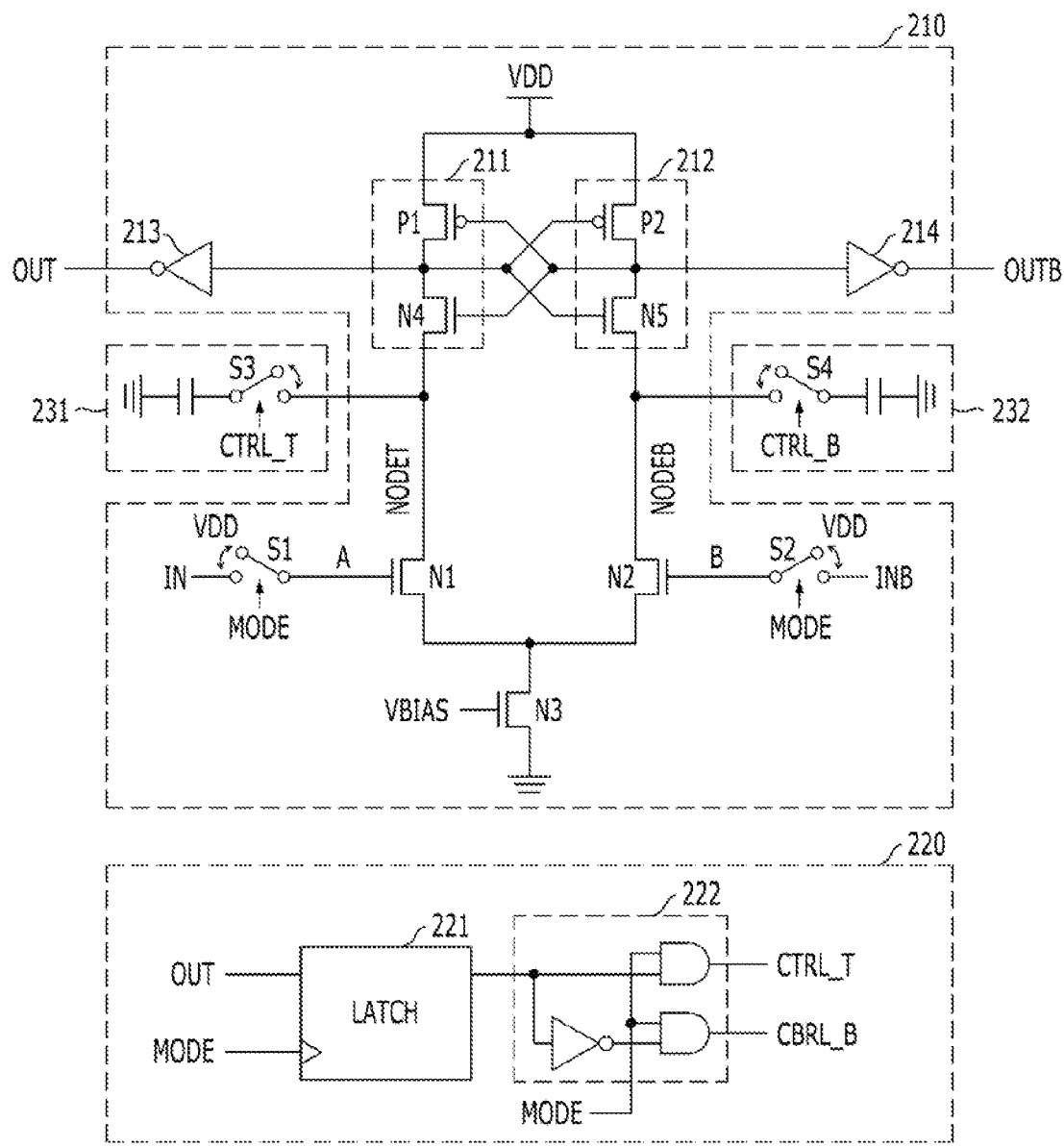
FIG. 4 is a circuit diagram of a differential amplifier circuit in accordance with another exemplary embodiment of the present invention.

FIG. 4 is a circuit diagram of a differential amplifier circuit in accordance with another exemplary embodiment of the present invention.

Referring to FIG. 4, the differential amplifier circuit is configured in such a manner that the transistors N6, N7, P3 and P4 are removed from the differential amplifier circuit of FIG. 2 and a bias voltage VBIAS is applied to a gate of the transistor N3 instead of the clock CLK. Thus, the differential amplifier circuit of FIG. 4 differentially amplifies signals of the input terminals A and B at all times without operating in synchronization with the clock CLK, that is, without performing a differential amplification operation only when the clock CLK is at a high level.

The differential amplifier circuit of FIG. 4 operates in the same manner as the differential amplifier circuit of FIG. 2, except that the differential amplifier circuit of FIG. 4 does not operate in synchronization with the clock but operates in an asynchronous manner. Thus, the detailed descriptions thereof are omitted herein.

In accordance with the embodiments of the present invention, it is possible to provide a technique capable of reducing an offset of a differential amplifier circuit through a simple configuration.

Although various embodiments have been described for illustrative purposes, it will be apparent to those skilled in the art that various changes and modifications may be made without departing from the spirit and scope of the invention as defined in the following claims.

What is claimed is:

1. A differential amplifier circuit comprising:
   an input terminal suitable for receiving a preset voltage at a measurement period and receiving an input signal at an operation period;
   a complementary input terminal suitable for receiving the preset voltage at the measurement period and receiving a complementary input signal at the operation period;
   a first pull-down element controlled by a signal of the input terminal and suitable for pull-down driving a first node using a voltage of a common source node;
   a second pull-down element controlled by a signal of the complementary input terminal and suitable for pull-down driving a second node using the voltage of the common source node;
   a first inverter suitable for using a pull-up voltage and a voltage of the first node as driving voltages and driving a pre-output node in response to a complementary pre-output node;
   a second inverter suitable for using the pull-up voltage and a voltage of the second node as driving voltages and driving the complementary pre-output node in response to the pre-output node;
   a third inverter suitable for driving an output terminal in response to the pre-output node;
   a fourth inverter suitable for driving a complementary output node in response to the complementary pre-output node;
   an offset control unit suitable for generating offset information using one or more signals of the output terminal and the complementary output terminal at the measurement period; and
   an offset compensation unit suitable for adjusting loadings of the first and second nodes in response to the offset information.

2. The differential amplifier circuit of claim 1, wherein the offset information comprises a first signal for increasing the loading of the first node and a second signal for increasing the loading of the second node, and
   the offset control unit stores at least one of the output signal and the complementary output signal at the measurement period, and activates one of the first and second signals using the stored signal at the operation period.

3. The differential amplifier circuit of claim 2, wherein the offset compensation unit comprises:
   a first capacitor connected to the first node when the first signal is activated; and
   a second capacitor connected to the second node when the second signal is activated.

4. The differential amplifier circuit of claim 1, further comprising a reset unit suitable for resetting the pre-output node, the complementary pre-output node, the first node, and the second node in response to a clock.

5. The differential amplifier circuit of claim 4, further comprising a third pull-down element enabled in response to the clock and suitable for pull-down driving the common source node using a ground voltage when enabled.

* * * * *